United States Patent [19]
Kim

[11] Patent Number: 6,090,715
[45] Date of Patent: Jul. 18, 2000

[54] MASKING PROCESS FOR FORMING SELF-ALIGNED DUAL WELLS OR SELF-ALIGNED FIELD-DOPING REGIONS

[75] Inventor: Sang-Yong Kim, Bucheon, Rep. of Korea

[73] Assignees: ANAM Semiconductor Inc., Seoul, Rep. of Korea; Amkor Technology, Inc., Chandler, Ariz.

[21] Appl. No.: 09/223,458

[22] Filed: Dec. 30, 1998

[30] Foreign Application Priority Data

Dec. 30, 1997 [KR] Rep. of Korea ............. 97-78398

[51] Int. Cl.[7] ................................ H01L 21/00
[52] U.S. Cl. ............. 438/692; 438/232; 438/527; 438/551; 438/735; 438/738; 438/757
[58] Field of Search ............... 438/232, 519, 438/527, 551, 692, 723, 724, 735, 738, 749, 751, 756, 757

[56] References Cited

U.S. PATENT DOCUMENTS

| | | | |
|---|---|---|---|
| 3,847,687 | 11/1974 | Davidsohn et al. | 148/187 |
| 4,144,101 | 3/1979 | Rideout | 148/1.5 |
| 4,435,896 | 3/1984 | Parrillo et al. | 29/571 |
| 4,558,508 | 12/1985 | Kinney et al. | 29/571 |
| 5,856,003 | 1/1999 | Chiu | 438/757 |

*Primary Examiner*—William Powell
*Attorney, Agent, or Firm*—Skjerven, Morrill, MacPherson, Franklin & Friel; Alan H. MacPherson

[57] ABSTRACT

A masking process for forming first and second ion-doped regions on a substrate of a semiconductor device. An oxide layer and a first nitride layer are formed on the substrate in order. The first nitride layer is etched using a photolithography process to form a first predetermined pattern which exposes portions of the oxide layer. The exposed portions of the oxide layer are then etched using the first predetermined pattern as an etching mask, until portions of the substrate corresponding to the first ion-doped regions are exposed. Next, first ions are doped into the exposed portions of the substrate using the first predetermined pattern as a doping mask. The first predetermined pattern is removed. A second nitride layer is then formed over the substrate and the patterned oxide layer. Portions of the second nitride layer are removed to reveal the top of the patterned oxide layer, forming a second predetermined pattern on the substrate. The patterned oxide layer is etched, using the second predetermined pattern as an etching mask, until portions of the substrate corresponding to the second ion-doped regions are exposed. Next, second ions are doped into the exposed portions of the substrate using the second predetermined pattern as a doping mask.

14 Claims, 1 Drawing Sheet

MASKING PROCESS FOR FORMING SELF-ALIGNED DUAL WELLS OR SELF-ALIGNED FIELD-DOPING REGIONS

FIELD OF THE INVENTION

The present invention relates to a process for making semiconductor devices, and more particularly, to a masking process for forming self-aligned dual wells or self-aligned field-doping regions.

BACKGROUND OF THE INVENTION

Generally, a CMOS (complementary metal oxide semiconductor) transistor comprises a semiconductor substrate on which N-channel MOS transistors and P-channel MOS transistors are formed. The semiconductor substrate is provided with active areas that are separated by either a LOCOS (localized oxidation of silicon) or a trench isolation method. N and P-type impurities are doped into the active areas to form N and P-wells. P-channel transistors are then formed on the N-wells while N-channel transistors are formed on the P-wells.

In the above described CMOS transistor manufacturing method, several lithographic masking steps are required in forming the N and P-wells. At least two lithographic masking steps are necessary for masking N-well regions when doping the P-type impurities on P-well regions and for masking the P-well regions when doping the N-type impurities on the N-well regions. The same lithographic masking steps are applied when forming the N and P-channel transistors.

Multiple lithographic masking steps are time-consuming and cause mask alignment errors, thereby deteriorating yield as well as increasing manufacturing costs. In an attempt to solve the above drawbacks, a method for making a dual-well CMOS transistor using only a single lithographic masking step has been developed. U.S. Pat. Nos. 4,558,508, 4,144,101, and 4,435,896 disclose such a method.

SUMMARY OF THE INVENTION

In accordance with the present invention, an improved masking process for forming self-aligned dual wells or self-aligned field-doping regions is provided, wherein only a single lithographic masking step is required.

In one embodiment, a method for forming first and second ion-doped regions on a substrate of a semiconductor device includes forming, in order, an oxide layer and a first nitride layer on the substrate. The first nitride layer is etched using a photolithography process to form a first predetermined pattern which exposes portions of the oxide layer. The exposed portions of the oxide layer are then etched using the first predetermined pattern as an etching mask, until portions of the substrate corresponding to the first ion-doped regions are exposed. Next, first ions are doped into the exposed portions of the substrate using the first predetermined pattern as a doping mask. The first predetermined pattern is removed. A second nitride layer is then formed over the substrate and the patterned oxide layer. Portions of the second nitride layer are removed to reveal the top of the patterned oxide layer, forming a second predetermined pattern on the substrate. The patterned oxide layer is etched, using the second predetermined pattern as an etching mask, until portions of the substrate corresponding to the second ion-doped regions are exposed. Next, second ions are doped into the exposed portions of the substrate using the second predetermined pattern as a doping mask.

In another embodiment, a process for forming a self-aligned mask for forming first and second ion-doped regions on a substrate of a semiconductor device includes forming, in order, an oxide layer and a first nitride layer on the substrate. The first nitride layer is etched using a photolithography process to form a first predetermined pattern which exposes portions of the oxide layer. The exposed portions of the oxide layer are then etched using the first predetermined pattern layer as an etching mask, until portions of the substrate corresponding to the first ion-doped regions are exposed. The first predetermined pattern is used as a doping mask for forming the first ion-doped regions. The first predetermined pattern is removed. A second nitride layer is then formed over the substrate and the patterned oxide layer. Portions of the second nitride layer are removed to reveal the top of the patterned oxide layer, forming a second predetermined pattern on the substrate. The patterned oxide layer is etched, using the second predetermined pattern as an etching mask, until portions of the substrate corresponding to the second ion-doped regions are exposed. The second predetermined pattern is used as a doping mask for forming the second ion-doped regions.

DETAILED DESCRIPTION

This application is substantially similar to Korean patent application No. 97-78398 filed on Dec. 30, 1997, disclosure of which is incorporated herein by reference.

In accordance with the present invention, a method for forming self-aligned dual wells or self-aligned field-doping regions is presented.

Figure 1:
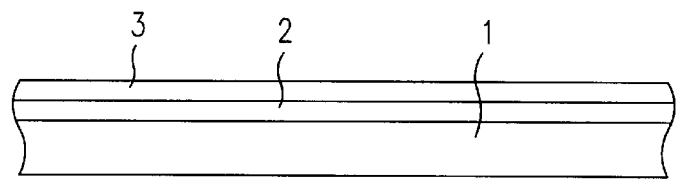
FIGS. 1–6 are cross-sectional views of a portion of a semiconductor device at various stages during the formation of a dual-well in accordance with an embodiment of the present invention.
Figure 2:
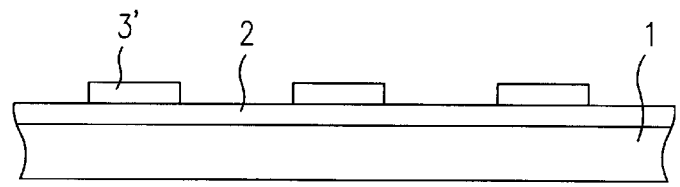
Figure 3:
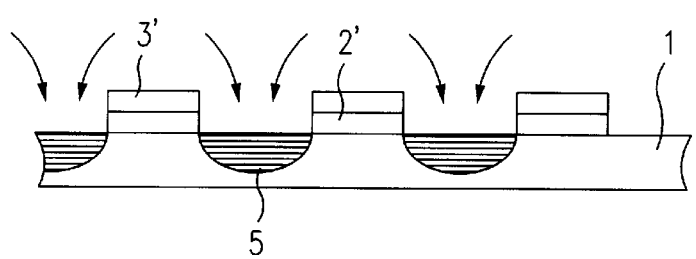

Referring first to FIG. 1, an oxide layer 2 and a first nitride layer 3 are formed on a semiconductor substrate 1 in order, through, for example, a CVD (chemical vapor deposition) process. Oxide layer 2 is preferably, but not limited to, silicon dioxide ($SiO_2$). Illustratively, first nitride layer 3 has a general formula $Si_xN_y$. Two particular examples are $SiN_4$ and $Si_3N_4$. First nitride layer 3 is then etched through a photolithography process to form a first predetermined pattern 3' which exposes portions of oxide layer 2, as shown in FIG. 2. The exposed portions of oxide layer 2 are etched to form a predetermined pattern 2', as shown in FIG. 3, exposing portions of substrate 1 that correspond to the doped regions, e.g. N-well. Next, first dopants (e.g., N-type impurities) are doped into substrate 1 through the exposed portions of substrate 1, using first predetermined nitride pattern 3' as a doping mask, thereby forming first wells 5 (e.g., N-wells) in substrate 1.

Figure 4:
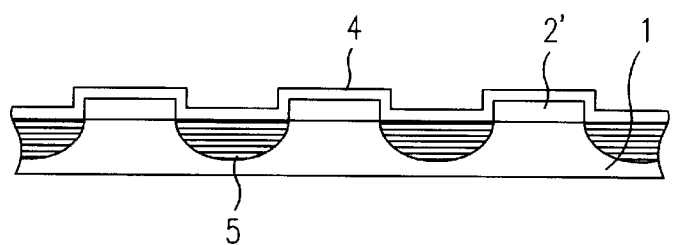

The following steps form second wells (e.g., P-wells) in substrate 1. As shown in FIG. 4, a second nitride (e.g. $Si_3N_4$) layer 4 is formed over substrate 1 and predetermined oxide pattern 2' through, for example, an LPCVD (a low pressure chemical vapor deposition) process after first predetermined nitride pattern 3' is removed through an etching process.

Figure 5:
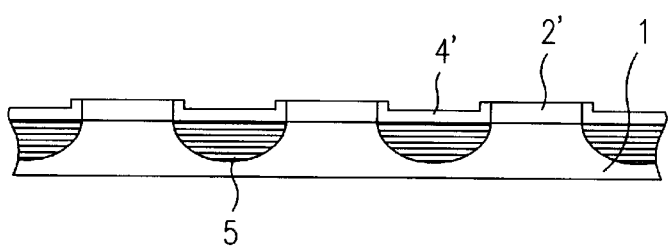
Figure 6:
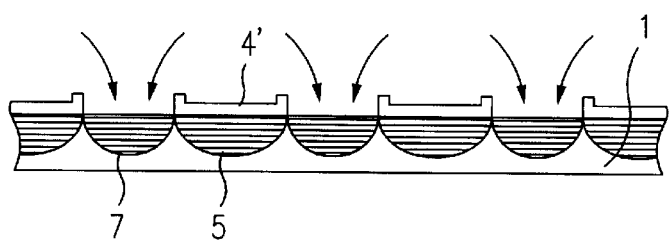

Next, portions of second nitride layer 4 are removed to form predetermined nitride pattern 4' through, for example, a CMP (chemical mechanical polishing) process, such that the top of predetermined oxide pattern 2' is exposed, as shown in FIG. 5. The predetermined oxide pattern 2' is then removed through an etching process to expose portions of substrate 1 that correspond to the doped regions (e.g. P-well)

as shown in FIG. 6. Second dopants (e.g., P-type impurities) are doped into substrate 1 through the exposed portions of substrate 1 using predetermined nitride pattern 4' as a doping mask, thereby forming second wells 7 (e.g., P-wells) in substrate 1.

While this invention has been described in reference to an embodiment, persons skilled in the art will recognize that changes may be made in form and detail without departing from the spirit and scope of the invention. Thus, the invention is limited only by the following claims.

I claim:

1. A masking process for forming first and second ion-doped regions in a substrate of a semiconductor device, said masking process comprising:

forming, in order, an oxide layer and a first nitride layer on the substrate;

etching the first nitride layer to form a first pattern using a photolithography process, thereby exposing portions of the oxide layer;

etching the exposed portions of the oxide layer using the first pattern of the first nitride layer as an etching mask, thereby exposing first portions of the substrate corresponding to the first ion-doped regions;

doping first ions into the exposed first portions of the substrate using the first pattern of the first nitride layer as a doping mask;

forming a second nitride layer over the substrate and the patterned oxide layer after removing the first pattern of the first nitride layer;

removing portions of the second nitride layer to form a second pattern of the second nitride layer;

etching the patterned oxide layer using the second pattern of the second nitride layer as an etching mask to expose second portions of the substrate, which correspond to the second ion-doped regions; and doping second ions into the exposed second portions using the second pattern of the second nitride layer as a doping mask.

2. The masking process of claim 1 wherein the first nitride layer includes material selected from the group consisting of $SiN_4$ and $Si_3N_4$.

3. The masking process of claim 1 wherein the second nitride layer comprises $Si_3N_4$.

4. The masking process of claim 2 wherein the second nitride layer comprises $Si_3N_4$.

5. The masking process of claim 1 wherein forming an oxide layer and a first nitride layer is performed through a chemical vapor deposition process.

6. The masking process of claim 1 wherein forming a second nitride layer is performed through a low pressure chemical vapor deposition process.

7. The masking process of claim 1 wherein removing portions of the second nitride layer is performed through a chemical mechanical polishing process.

8. A process for making a self-aligned mask for forming first and second ion-doped regions in a substrate of a semiconductor device, said process comprising:

forming, in order, an oxide layer and a first nitride layer on the substrate;

etching the first nitride layer to form a first pattern using a photolithography process, thereby exposing portions of the oxide layer, the first pattern being a first mask for forming the first ion-doped regions;

etching the exposed portions of the oxide layer to expose portions of the substrate corresponding to the first ion-doped regions;

forming a second nitride layer over the substrate to cover the patterned oxide layer after removing the first pattern of the first nitride layer;

removing portions of the second nitride layer to form a second pattern of the second nitride layer on the substrate, the second pattern being a second mask for forming the second ion-doped regions; and etching the patterned oxide layer to expose portions of the substrate corresponding to the second ion-doped regions.

9. The process of claim 8 wherein the first nitride layer includes a material selected from the group consisting of $SiN_4$ and $Si_3N_4$.

10. The process of claim 8 wherein the second nitride layer comprises $Si_3N_4$.

11. The process of claim 9 wherein the second nitride layer comprises $Si_3N_4$.

12. The process of claim 8 wherein forming an oxide layer and a first nitride layer is performed through a chemical vapor deposition process.

13. The process of claim 8 wherein forming a second nitride layer is performed through a low pressure chemical vapor deposition process.

14. The masking process of claim 8 wherein removing portions of the second nitride layer is performed through a chemical mechanical polishing process.

* * * * *